United States Patent [19]

Müller

[11] 4,430,009
[45] Feb. 7, 1984

[54] ARRANGEMENT FOR SECURING AND ELECTRICALLY CONTACTING A BATTERY IN A WATCH

[75] Inventor: Jacques Müller, Reconvilier, Switzerland

[73] Assignee: ETA S.A. Fabriques d'Ebauches, Switzerland

[21] Appl. No.: 248,253

[22] Filed: Mar. 27, 1981

[30] Foreign Application Priority Data

Mar. 31, 1980 [CH] Switzerland .......................... 2534/80

[51] Int. Cl.³ .............................................. G04B 1/00
[52] U.S. Cl. .................................... 368/203; 368/202; 429/98
[58] Field of Search ................. 368/88, 204, 203, 202; 429/96, 98; 339/152, 17 C, 75 R, 75 M

[56] References Cited

U.S. PATENT DOCUMENTS

| 2,985,704 | 5/1961 | Kempf et al. | 429/98 |
| 3,283,495 | 11/1966 | Hetzel et al. | 368/202 |
| 4,095,412 | 6/1978 | Burke | 368/204 |
| 4,143,507 | 3/1979 | Ganter et al. | 368/203 |
| 4,201,040 | 5/1980 | Wakayama | 368/204 |
| 4,241,436 | 12/1980 | Bolzt et al. | 368/88 |

FOREIGN PATENT DOCUMENTS 444766 2/1968 Switzerland .

*Primary Examiner*—Bernard Roskoski
*Attorney, Agent, or Firm*—Allegretti, Newitt, Witcoff & McAndrews, Ltd.

[57] ABSTRACT

An electronic watch having an improved arrangement for securing and electrically contacting a battery. The battery is held in the plate of the watch by a clamp bar 10 which is fixed by screws 12a, b at its ends. Interposed between the non-earthy terminal of the battery and the clamp bar 10 is an insulating plate member 16 which comprises a conductor 18 in contact with the terminal. The plate member 16 is connected to the printed circuit 20 by a flexible tongue 16a with a conductor track 18a connecting the conductor 18 to the track 22 of the printed circuit 20.

7 Claims, 3 Drawing Figures

ARRANGEMENT FOR SECURING AND ELECTRICALLY CONTACTING A BATTERY IN A WATCH

BACKGROUND OF THE INVENTION

The present invention concerns an arrangement for securing and electrically contacting a battery in an electronic watch, for making an electrical contact between one of the terminals of the battery and the printed circuit of the watch. The term "battery" is employed herein in accordance with common usage to comprehend a single cell.

In known watches, the double function of securing the battery in the plate of the watch and making electrical contact has been performed by a single component comprising a clamp bar which is screwed to the body of the watch at each of the ends of the bar. The metal bar applies a pressure which provides both for mechanically holding the battery in position and electrical contact; the electrical circuit runs for example through one of the fixing screws. However, the fixing screws have to be insulated with respect to the conducting clamp bar or with respect to the plate of the watch, generally by means of insulating washers or bushes. It will be appreciated that the provision of such insulating washers or bushes increases the amount of space which has to be provided for the screws and therefore the overall amount of space occupied by the clamp bar within the peripheral casing of the watch.

BRIEF SUMMARY OF THE INVENTION

In order to overcome this disadvantage, an object of the invention is to provide a securing and electrical contacting arrangement which makes it possible to reduce the space that it occupies in the casing member of the watch. It is also an object of the invention to provide such an arrangement, which can be easily installed in the watch casing, and which permits the battery to be changed easily, without any need for long and complicated dismantling operations.

With a view to meeting these objects, the present invention provides a watch comprising a plate and a printed circuit on a substrate, and a fixing arrangement for a battery comprising a clamp bar which is removably fixed at its two ends to a face of the plate and which passes over a first face of the battery, a second face of which rests on the plate; and electrical connecting means comprising a flexible insulating tongue of which one end is fixed with respect to the insulating substrate while the other end is disposed between the clamp bar and the first face of the battery and carries a conductor which contacts a terminal in the said first battery face and is connected to a conductive track of the printed circuit.

BRIEF DESCRIPTION OF THE DRAWINGS

The invention will be described in more detail, by way of example, with reference to the accompanying drawings, in which.

DETAILED DESCRIPTION OF THE PREFERRED EMBODIMENT

Figure 2:
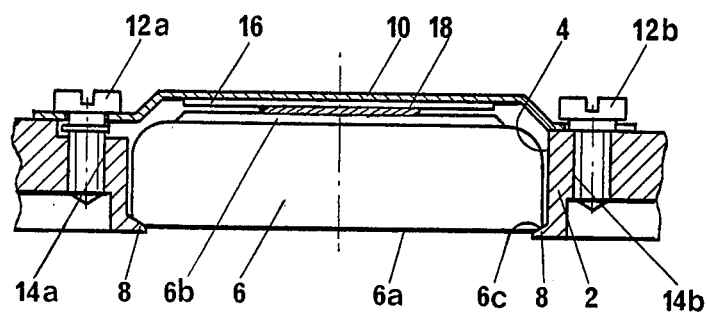
FIG. 2 is a view in vertical section taken along line II—II in FIG. 1, showing the battery with its fixing and electrical contacting arrangement.
Figure 1:
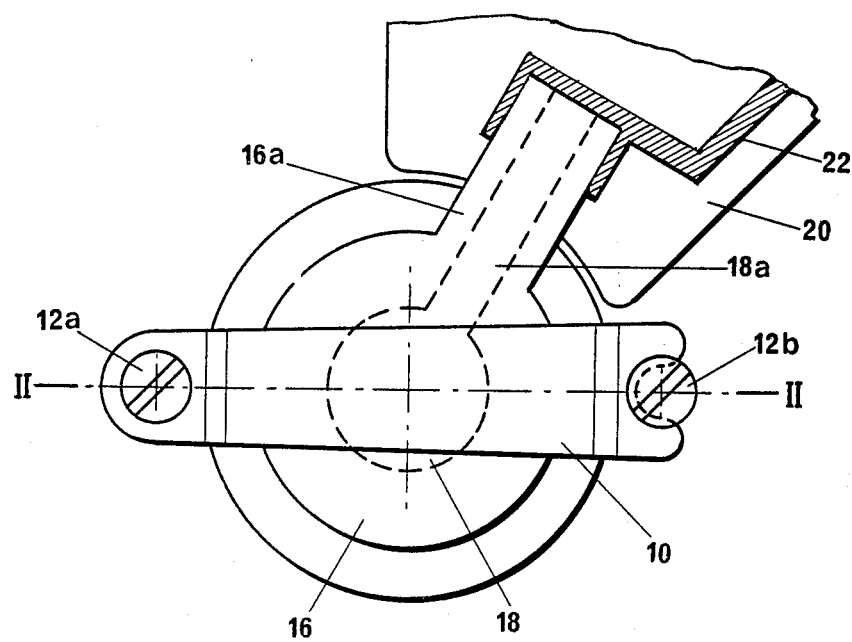
FIG. 1 is a plan view of an illustrative embodiment of the invention showing the securing and electrical contacting arrangement for holding the battery in the watch case and providing an electrical connection to the printed circuit.

FIGS. 1 and 2 show a part of the watch plate 2 which comprises a cylindrical recess 4 in which the battery 6 is placed. The bottom 6a of the battery is held in position by a bevelled internal rim 8, which projects inwardly of the recess 4. The rim 8 may also form the electrical earth contact for the battery. Thus, the bottom 6a of the battery is connected to the cylindrical periphery thereof by a rounded edge 6c which bears on the bevelled rim 8. More generally, the bottom 6a of the battery may be domed with the peripheral margin of the bottom of the battery resting on the rim 8. This particular arrangement which provides for supporting the battery by means of the plate 2 makes it possible to use the whole of the depth of the casing of the watch, for housing the battery. In other words, the thickness of the battery is substantially equal to the internal thickness of the watch casing. However, it would also be possible for the bottom 6a of the battery to rest on a solid bottom in the recess 4 formed in the plate 2.

Above the upper face of the battery, that is to say, above its non-earthy terminal 6b, there is a metal clamp bar 10, the ends of which are fixed to the plate 2 by screws 12a and 12b which are engaged into threaded holes 14a and 14b in the plate 2. A flexible, insulating plate member or pad 16 is introduced between the central portion of the clamp bar 10 and the terminal 6b of the battery; the lower face of the plate member 16, that is to say, the face which is toward the electrode, is partially covered by a metal conductor 18. The plate member 16 is extended by a flexible tongue 16a which is fixed on the substrate 20 of the printed circuit of the watch. The conductor 18 is extended by a conductor track 18a which is deposited on the lower face of the tongue 19, the conductor track 18a being connected to a conductor track 22 of the printed circuit. Preferably, the mechanical and electrical connections between the substrate 20 of the printed circuit and the tongue 16a, 18a is effected by bonding but it would be equally possible to use a weld or solder.

It will be appreciated that the mechanical retaining function of the clamp bar 10 is separated from the electrical contacting function which is performed by the conductor 18 and the extension portion 18a thereof, insulation between the clamp bar and the conductor being provided by the flexible plate member 16.

Furthermore, it will be apparent that the battery can be very easily replaced. The clamp bar 10 is removed in conventional manner by undoing the screws 12a and 12b. Then, as the insulating tongue 16a is very flexible, it is easy for it to be raised sufficiently to be able to remove or insert the battery 6, without damaging the conductor deposit 18, 18a.

Figure 3:
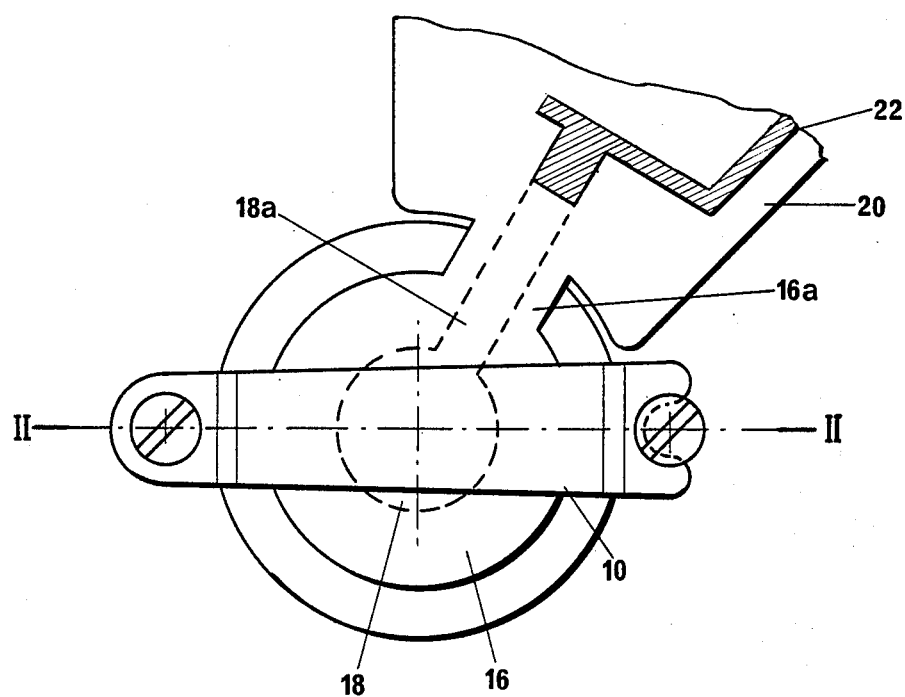
FIG. 3 is a plan view similar to that of FIG. 1, showing an alternative embodiment of the invention.

If the substrate 20 of the printed circuit is rigid, the tongue 16 must be flexible and must therefore be a component which is independent of the substrate 20. In contrast, when a printed circuit having a flexible substrate is used, it is highly advantageous for the assembly formed by the plate member 16 and the tongue 16a to be an integral part of the substrate 20 of the printed circuit, this being the embodiment of the invention shown in FIG. 3.

Moreover, it is evident that the metal clamp bar 10 is sufficiently rigid not only to ensure that the battery 6 is held in position in its housing 4, but also to produce sufficient pressure on the plate member 16 to make good electrical contact between the terminal 6b and the conductor deposit 18. Although the clamp bar does not perform any electrical conductor function, it is virtually necessary for it to be made of metal for it to apply sufficient pressure.

By way of example, the metal bar 10 may be of the order of 0.08 mm in thickness and the insulating plate member 16 may advantageously be made of an insulating material of the "Kapton" type, of the order of 0.07 mm in thickness.

It will be seen from the foregoing description that the arrangement according to the present invention provides a substantial reduction in the amount of space involved in securing the battery in place and making the electrical contact, in relation to the prior art arrangements. It will be seen in particular that, in relation to the prior art, the only extra thickness is due to the presence of the insulating plate member 16, which is very small. In return, there is a reduction in the space occupied by insulating members in particular at the location of the fixing screws. This therefore corresponds to an overall saving in space both in the dimension of the thickness of the peripheral casing of the watch and in the dimension of the diameter or width thereof.

While exemplary embodiments of the invention have been disclosed for purposes of illustration, it will be understood that other modifications may be made within the principles of the invention and the scope of the appended claims.

What is claimed is:

1. An electronic watch comprising a plate; a printed circuit including an insulating substrate and at least one conductive track; and a fixing arrangement of a battery having first and second faces, comprising a clamp bar which is removably fixed at its two ends to a face of said plate and which passes over said first face of the battery, said second face of the battery resting on said plate; and electrical connecting means including a flexible insulating tongue having a first end fixed with respect to said insulating substrate and a second end which is disposed and maintained between said clamp bar and said first face of the battery and carrying a conducting layer which contacts a terminal in the said first battery face and is connected to a conductive track of the printed circuit, said flexible tongue being adapted to be bent for permitting easy removal of the battery.

2. The electronic watch of claim 1 wherein said second face of the battery is domed round the edge of said second face and said plate is provided with a hole which extends through the entire thickness of the plate, the edge of the hole in the face of the plate to which said clamp bar is not fixed being provided with an internal rim against which the edge of the second face of the battery rests.

3. An electronic watch according to claim 1 or 2, wherein the tongue is a component which is fixed to the substrate of the printed circuit.

4. An electronic watch according to claim 1 or 2, wherein the tongue and substrate of the printed circuit form a single component.

5. An electronic watch according to any of claims 1 or 2, wherein the said second end of the insulating tongue enlarges into an insulating plate member between the clamp bar and the first face of the battery.

6. An electronic watch according to claim 3, wherein the said second end of the insulating tongue enlarges into an insulating plate member between the clamp bar and the first face of the battery.

7. An electronic watch according to claim 4, wherein the said second end of the insulating tongue enlarges into an insulating plate member between the clamp bar and the first face of the battery.

* * * * *